United States Patent [19]

Lebailly

[11] 3,927,344

[45] Dec. 16, 1975

[54] MONOLITHIC SEMICONDUCTOR DEVICE INCLUDING A PROTECTED ELECTROLUMINESCENT DIODE

[75] Inventor: Jacques Lebailly, Caen, France

[73] Assignee: U.S. Philips Corporation, New York, N.Y.

[22] Filed: July 2, 1974

[21] Appl. No.: 485,202

[30] Foreign Application Priority Data

July 3, 1973 France .............................. 73.24413

[52] U.S. Cl. .................................. 313/499; 357/17
[51] Int. Cl.[2] .................... H01L 33/00; H05B 33/02
[58] Field of Search ........................ 313/499; 357/17

[56] References Cited

UNITED STATES PATENTS

| | | | |
|---|---|---|---|
| 3,330,983 | 7/1967 | Cusano et al. | 313/499 |
| 3,560,275 | 2/1971 | Kressel et al. | 357/17 |
| 3,577,043 | 5/1971 | Cook | 357/41 |
| 3,690,965 | 9/1972 | Bergh et al. | 357/17 |
| 3,739,241 | 6/1973 | Thillays | 357/17 X |

OTHER PUBLICATIONS

"Lighting Up in a Group," by L. A. Murray et al., *Electronics*, Mar. 4, 1966, pp. 104–110.

*Primary Examiner*—Palmer C. Demeo
*Attorney, Agent, or Firm*—Frank R. Trifari; Ronald L. Drumheller

[57] ABSTRACT

A monolithic electroluminescent device having overload protection, comprising in parallel with an electroluminescent diode, a diode having a higher dynamic admittance than said electroluminescent diode at higher currents and an internal potential difference that is higher than the voltage corresponding to the minimum energy of the radiation recombination junction of said electroluminescent diode.

13 Claims, 5 Drawing Figures

MONOLITHIC SEMICONDUCTOR DEVICE INCLUDING A PROTECTED ELECTROLUMINESCENT DIODE

The present invention relates to a monolithic semiconductor device comprising at least one electroluminescent diode having a p-n junction the light power of which during operation obtains a maximum value $B_M$ when it is traversed by a current $I_M$ under a supply voltage $V_M$.

It is to be noted that the terms used hereinafter of radiation efficiency, light flux, luminous efficiency, luminescence, sensitive radiation apply to radiation which is emitted by an electroluminescent emitter in the energy range used corresponding to the sensitivity range of the receiver. So the terms apply to the visible range, but also to other radiations, such as the infrared, for example in the case of a photocoupling device having infrared-sensitive receivers.

The radiation efficiency of electroluminescent junction diodes reduces during operation. This reduction is accelerated when considerable currents pass through the diode and the diode may even be destroyed if the current obtains a high value. The electroluminescent diode should be protected against overload and excess voltage so as to avoid reduction of luminescent properties. This is necessary in particular in the case of mosaics of luminescent diodes, especially when these are arranged according to an XY matrix. A protection by discrete elements such as current limiting resistors which are arranged in series with insulated diodes cannot be considered due to the lack of space and the fact that said elements are insufficiently reliable. Furthermore, because the current consumption of the electroluminescent diodes is an important factor to be considered, the protection against overload or excess voltage should not consume too much current itself, at least during normal operation of the diode.

One of the objects of the invention is to provide a device having an electroluminescent diode with the p-n junction protected against overload and excess voltage so as to maintain the luminescent properties.

Another object of the invention is to reduce the intensity of the current which flows through an electroluminescent diode when the supply current tends to exceed the value which corresponds to the maximum light power which is normally emitted during operation, without the emitted light power being considerably reduced when the supply current becomes lower than or remains equal to said value.

Another object of the invention is to protect an electroluminescent diode against overload and excess voltage by means of elements integrated in the same substrate as the diode.

According to the invention, the monolithic semiconductor device has at least one electroluminescent diode with a p-n junction the light power of which during operation should reach a maximum value $B_M$ when it is traversed by a current $I_M$ under a supply voltage $V_M$, is characterized in that it comprises. Parallel to the electroluminescent diode and connected in the same direction is a diode having a p-n junction with an internal potential difference that is considerably larger than the voltage which corresponds to the minimum energy of the radiation recombination junction in the electroluminescent diode. The parallel diode also has a dynamic admittance which is higher than that of the electroluminescent diode, at least for all supply voltages which are higher than $V_M$.

The internal potential difference of the junction of the parallel diode corresponds to the deviation between the quasi-Fermi levels on either side of the junction thereof and is higher than the voltage which corresponds to the minimum energy for which the electroluminescent diode has a sensitive light emission. As a result of this, the parallel diode passes substantially no current in the energization level region from zero to a voltage equal to said potential difference and the normal operation of the electroluminescent diode is not disturbed.

At a supply voltage higher than the internal potential difference of the parallel diode, the dynamic admittance of the parallel diode exceeds the dynamic admittance of the electroluminescent diode during operation. Above therefore the greater part of the supply current passes through the parallel diode, thus protecting the electroluminescent diode.

In FIG. 1 of the drawings, reference numeral 1 denotes in linear coordinates the curve which is characteristic of the current $I$ as a function of the voltage $V$ which is applied across the electroluminescent diode. As is known, said curve has a bend near a voltage $V_D$ from which the dynamic impedance of the dynamic diode decreases rapidly. The voltage $V_D$ often is, but for 0.1 volt, near the minimum energy of the recombination junction in the electroluminescent diode.

Reference numeral 2 denotes the characteristic for the parallel diode which is parallel to the electroluminescent diode. Curve 2 shows a bend near the voltage $V_E$ which is higher than $V_D$ and which corresponds substantially to the internal potential difference of the junction of said parallel diode. From $V_E$ the admittance and the dynamic admittance of the parallel diode rapidly increase and above $V_m$, which is the common supply voltage for the two diodes and which corresponds to the maximum light power during operation of the electroluminescent diode, the dynamic admittance of the parallel diode is higher than the dynamic admittance of the electroluminescent diode. The current in the parallel diode rapidly becomes decisive. The electroluminescent diode receives an ever smaller part of the overall supply current and is thus protected against overload.

It is favorable to use the second diode not only for the direct protection of the electroluminescent diode against the overload, but also against the reverse voltages which might sometimes be applied to the same. In a favorable embodiment of the invention the parallel diode is a diode having a reverse breakdown effect in which the concentration of doping impurities on either side of the junction is larger than the concentration of doping impurities on either side of the junction of the electroluminescent diode. The higher doping level of the diode having breakdown effect results in an inverse breakdown voltage which is weaker than that of the electroluminescent diode, which thus is also protected. The diode having breakdown effect may be a Zener diode or an avalanche diode.

Diodes have been used for detecting signals where the diodes are within the same monolithic plate and one has a higher threshold voltage and a lower dynamic resistance than the other. In these devices, however, such as those described in U.S. Pat. No. 3,418,587, the two diodes have the same function, must be of the same nature and must be manufactured from the same material which is adapted to said function. Furthermore the protection against inverse overload is not ensured because the diode having breakdown effect when the same is used is biased in a direction which is opposite to that of the other diode.

The mutual characteristics of the two diodes which form part of the monolithic device according to the invention may be obtained by various means. In a first embodiment the material of the electroluminescent diode and that of the parallel diode have related compositions and the crystal lattices of the two materials correspond, which enables the realization of epitaxial deposits of one on the other. In order that the internal potential difference of the parallel diode will be higher than the voltage which corresponds to the minimum energy of the radiation recombination junction in the electroluminescent diode, a material having a larger forbidden bandwidth is preferably chosen for the parallel diode. For example, the materials of both diodes may be related III–V compounds, the composing elements of which belong to columns III and V of the periodic table of elements and the material of the two diodes having at least one element of the two columns in common. For example, the electroluminescent diode may be of gallium arsenide, the forbidden bandwidth of which is 1.4 eV, which corresponds to an energy radiation emission of 1.4 eV, while the second diode may be of gallium aluminum arsenide, $Ga_{1-x}Al_xAs$ with $0.05 < x < 0.02$, the forbidden bandwidth of which is 1.5 eV, which corresponds to an internal potential difference for junction on the order of 1.5 eV. In this example the doping level of gallium aluminum arsenide, from which the parallel diode is manufactured, is higher than that of gallium arsenide, from which the electroluminescent diode is manufactured, so that a sufficiently weak dynamic resistance is obtained.

For carrying out this embodiment, the starting material may be a plate of $GaAs_{1-x}P_x$ or $Ga_{1-y}Al_yAs$, in which $x$ and $y$ are between 0 and 0.9 and an epitaxial deposit of a compound $GaAs_{1-x1}\ P_{x1}$ or $Ga_{1-y1}\ Al_{y1}$ As, in which $x + 0.05 \leqslant x' \leqslant x + 0.2 \leqslant 1$ and $y + 0.05 \leqslant y' \leqslant y + 0.2 \leqslant 1$.

In another embodiment the electroluminescent diode and the parallel diode may be manufactured from materials of the same composition, for example, a binary III–V compound, such as gallium arsenide, and the doping impurities in the various regions of the two diodes are of different natures and concentrations, so that the internal potential difference of the p-n junction of the parallel diode is higher than the voltage which corresponds to the minimum energy of the radiation recombination junction in the electroluminescent diode. This embodiment enables the use without difficulty of conventional manufacturing methods for semiconductor devices, such as vapor phase epitaxy, liquid phase epitaxy, ion implantation or other methods.

The two diodes may be manufactured, for example, from a III–V compound material like $GaAs_{1-x}P_x$, in which $1 \geqslant x \geqslant 0.8$, wherein the electroluminescent diode is doped with nitrogen in a concentration which is between $10^{17}$ and $10^{20}$ at/cm$^3$, while the parallel diode has no nitrogen doping.

According to a particular embodiment which follows from the embodiment just described, the electroluminescent diode is manufactured from a highly doped semiconductor material and compensated to a given extent, for example a material doped with an amphoteric element, and the parallel diode is manufactured from a dope and non-compensated material of the same composition. The electroluminescent diode, may be, for example, gallium arsenide which is doped with silicon in the two regions of opposite conductivity types. In this material a radiation recombination junction may occur between the "tail" of the conductance band and the band of acceptor impurities used, with an energy which is considerably lower than the forbidden bandwidth of the base material. The parallel diode may be, for example, of gallium arsenide of the n-type doped with tellurium, in which zinc is diffused to form a p-type region. The electroluminescent diode which is doped with silicon and which is amphoteric is preferably manufactured by epitaxy from the liquid phase.

In a variation of the various embodiments just described, the monolithic semiconductor device according to the invention comprises, in addition to an electroluminescent diode and a parallel diode for the protection of the electroluminescent diode, a current path which is parallel to said diodes, in which the characteristic features of said path are decisive to produce a threshold effect of the electroluminescence. An example of such a path is in the device which forms the subject matter of U.S. application Ser. No. 485,225 filed simultaneously with the present application in my name and entitled: Electroluminescent Diode Having Threshold Effect. Said path shows a strong impedance relative to that of the electroluminescent diode when the energization level is comparatively high and therefore does not disturb the effect of the safety diode, while the safety diode has a high impedance when the energization level is comparatively low and therefore does not disturb the threshold effect which is caused by said current path.

The electroluminescent diodes which may be used for the application of the present invention may be manufactured from the III–V or II–VI semiconductor compounds having two, three or four components using any of the manufacturing technology of semiconductor devices. This is also the case with the parallel diode which may be obtained by diffusion, by combination of successive or coinciding diffusions, by out-diffusion, by evaporation, by alloying or by epitaxy.

When the parallel diode has been manufactured with materials of the same nature as the material of the electroluminescent diode, it may also be light emissive. Depending upon the specifications of the device, it may prove necessary to attenuate light emission of the parallel diode as much as possible, for example, in the case of a photocoupling device. The undesired light emission of the parallel diode may be attenuated or substantially removed by choosing materials and a geometry which give a maximum light absorption, say by means of a contact electrode having a completely opaque surface.

The invention may be used for protecting electroluminescent diodes in their various fields of application.

The invention may be applied in particular to electroluminescent diodes of photocoupling devices and to diodes of logical opto-electronic devices. The invention may also be applied to integrated or polylithic electroluminescent display diodes in discrete elements or in mosaics.

The invention will now be described in greater detail with reference to the accompanying drawings.

FIG. 1 graphically illustrates voltage-current characteristics for two diodes according to the invention.

Figure 1:
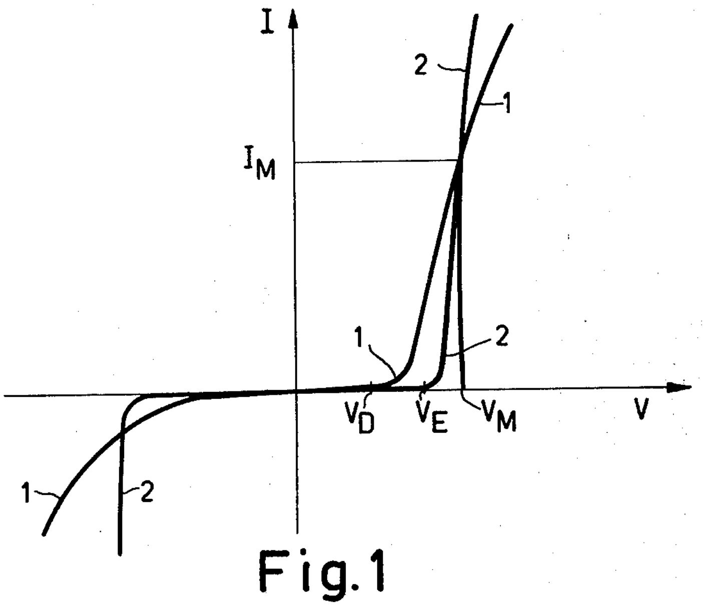
Figure 2:
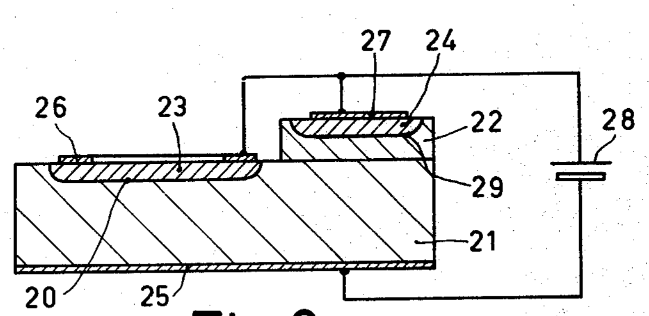
FIG. 2 is a diagrammatic sectional view of a first embodiment of a device according to the invention.

The device shown diagrammatically in the sectional view of FIG. 2 is composed, for example, of a plate 21 of gallium arsenide of the n-type. A junction 20 has been formed by a zinc-doped diffused region 23 of the p-type. A small part of the surface of the plate 21 is covered with an epitaxial deposit 22 of gallium aluminum arsenide with 5% aluminum of the n+ type doped with tellurium, in which a zinc-doped diffused region 24 of p-type forms a junction 29. The plate 21 has a metal contact deposit 25 on the surface present opposite to the diffused regions and the diffused regions are provided with metal contact deposits 26 and 27, respectively. The two diodes of the device are biased in parallel in the forward direction by means of a source 28.

The junction 20 becomes electroluminescent and emits in the infrared when a current is injected by the source 28. The thickness of the layer 22 is minimum and the concentrations of impurities, in the above-described case tellurium, are higher than in the substrate 21, so that the dynamic impedance will be larger and the breakdown voltage between the electrodes 25 and 27 smaller than between the electrodes 25 and 26.

Figure 3:
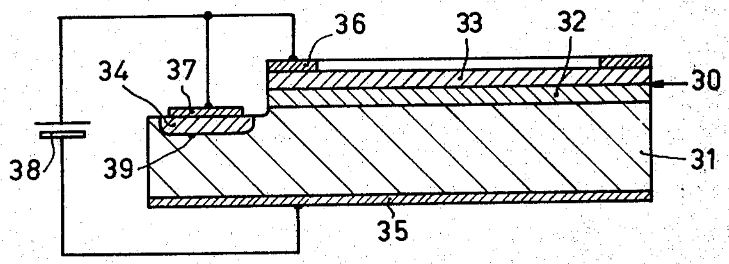
FIG. 3 is a diagrammatic sectional view of a second embodiment of a device according to the invention.

The device shown diagrammatically in the sectional view of FIG. 3 consists, for example, of a plate 31 of gallium arsenide of the n+ type which is doped with tellurium. On a surface of said plate a gallium arsenide deposit has been manufactured in two layers by epitaxy in a liquid solution of which a surface layer 33 of the p-type and an underlying layer 32 of the n-type mutually form a junction 30. These two layers are obtained by the addition of silicon to the epitaxy liquid in a concentration in the order of 0.2% by weight so that during the successive depositions, which are carried out between 950°C and the ambient temperature, a doping of the n-type and then a doping of the p-type is obtained. The epitaxy is either carried out locally or a small part of the manufactured deposit is removed and on the exposed part of the plate a region 34 of the p+ type which is zinc-doped forms a junction 39. The plate 31 has a metal contact layer 35 on the surface opposite to the epitaxial deposit. The diffused region has a metal contact surface 37 and the epitaxial layer 33 has a metal contact deposit 36 in the form of a ring, inside of which the electroluminescent diode formed by the regions 32 and 33 may emit radiation through the outer surface of layer 33.

The two diodes of the device are supplied in parallel by means of a source 38 which biases the diodes in the forward direction.

The electroluminescent diode with junction 30 has a junction surface of $10^{-3}$cm$^2$, for example a square of $300 \times 300\mu$. It has an efficiency of 5%. At a current of 10 mA at 1.15 volt the emitted power is 0.6 mW and at a current of 20 mA at 1.25 volt the emitted power is 1.3 mW. The parallel diode 39 has a junction surface of $10^{-4}$cm$^2$, for example $30 \times 300\mu$, and the diffused region 34 has a depth of $10\mu$. Up to 20 mA the impedance of the parallel diode is larger than the impedance of the electroluminescent diode and above 20 mA it is smaller. The electroluminescent diode is used, for example, at 10 mA during normal operation.

Figure 4:
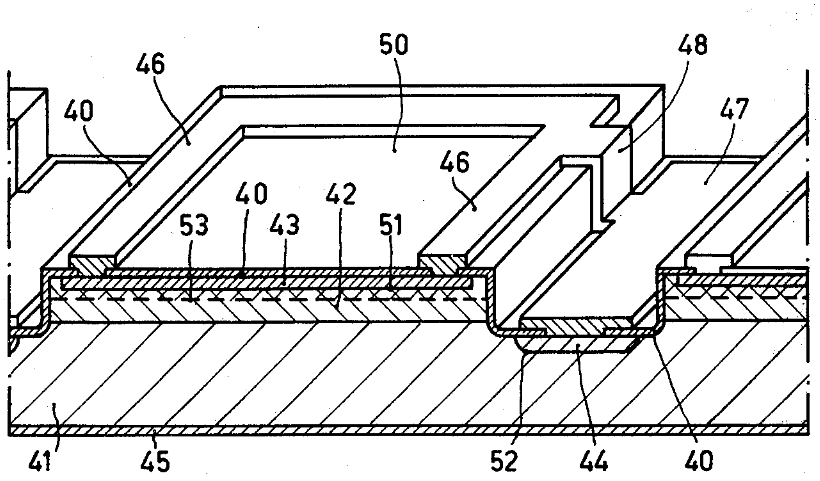
FIG. 4 is a partial diagrammatic sectional view in perspective of a third embodiment of a device according to the invention.

The device shown diagrammatically in the partial sectional view of FIG. 4 consists of a row of electroluminescent diodes which are manufactured on a substrate 41 of gallium phosphide which is doped with a concentration of impurities which corresponds to the desired inverse breakdown voltage so as to ensure the protection of the diode against excess voltage in the reverse direction. The doping impurities are, for example selenium, sulphur or tellurium. The substrate 41 is covered with an epitaxial layer 42 for example, of gallium arsenide $GaAs_{1-x}P_x$, where $x = 0.9$. The layer 42 is deposited by a vapor phase or liquid phase process and is doped entirely with impurities of the same type but with a smaller concentration in the substrate 41. The upper part of said epitaxial layer, down to a depth which corresponds to the broken line 53 in the Figure, is moreover doped with radiation recombination centers, for example nitrogen or oxygen. For each parallel diode a part of the surface of the substrate is etched away down to a depth which makes it possible to reach the original substrate 41. Local diffusions of zinc form on the one hand regions 43 in the layer 42 and on the other hand regions 44 in the parts of the substrate exposed by etching. The junctions 51 between the regions 43 and the layer 42 have a large area and are electroluminescent. The junctions 52 between the regions 44 and the substrate 41 form protection diodes. Said diodes are arranged in parallel with the electroluminescent diodes by depositing an insulating layer 40 on the surface of the device, by making windows in the insulating layer 40 above the regions 43 and 44 and by depositing metal conductors 46 on the circumference of the opened windows above the electroluminescent regions 43, metal conductors 47 on the opened windows above the regions 44 and metal conductors 48 which connect each conductor 46 to a conductor 47. A metal deposit 45 is provided on the other surface of the substrate and the supply voltage source of the device is connected at one end to the deposit 45 and at the other end to each conductor assembly 46, 47, 48. The emission surface of the electroluminescent diode is protected by a transparent insulating layer 50.

Figure 5:
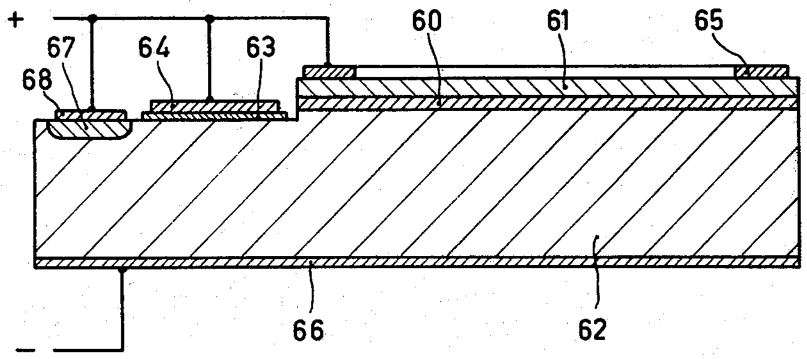
FIG. 5 is a diagrammatic sectional view of a fourth embodiment of a device according to the invention.

The device shown in FIG. 5 comprises an electroluminescent diode which is formed by a first region 61 which has been deposited epitaxially on the layer 60 which forms a second region which itself has been deposited by epitaxy on a plate 62. The plate is, for example, of the n+ conductivity type and strongly doped. The layer 60 is of the n-type and the region 61 of the p-type. On a part of the surface of the plate 62 a region 67 of the p-type is diffused. On another part of the surface of the plate 62 a layer 63 is provided of a material which forms a junction of the Schottky type with the material of the plate 62.

Contact means are provided: at 68 on the diffused region 67, at 64 on the layer 63, at 65 on the region 61 and at 66 on the plate 62. The three diodes of the device are supplied in parallel by means of a current source. The threshold voltage of the Schottky junction 63/62 is a fraction of the threshold voltage of the junction 61/60 and the threshold voltage of the junction 67/62 is higher than the threshold voltage of the junction 61/60, which is obtained, for example, by using for the electroluminescent diode 61/60 a material which is strongly compensated. With this device an electroluminescent diode is available having a threshold effect which is protected against overload and possible excess voltage.

What is claimed is:

1. A monolithic semiconductor device comprising an electroluminescent diode and a parallel diode electrically connected in the same direction as said electroluminescent diode and parallel therewith, the p-n junction of said parallel diode having an internal potential difference substantially greater than the voltage corresponding to the minimum energy of the radiation recombination junction of said electroluminescent diode and the dynamic admittance of said parallel diode being substantially greater than the dynamic admittance of said electroluminescent diode, at least in the operating region of maximum desired light power, whereby the current passed by said parallel diode relative to the current passed by said electroluminescent diode during forward biasing of said diodes is not significant except in the operating region of maximum desired light power where said substantially greater dynamic admittance of said parallel diode results in said parallel diode passing an increasing percentage of the current at higher bias levels protecting said electroluminescent diode from overloading.

2. A device as defined in claim 1 wherein said parallel diode has an inverse breakdown effect at an inverse breakdown voltage which is lower than the inverse breakdown voltage of said electroluminescent diode, thereby protecting said electroluminescent diode from inverse breakdown.

3. A device as claimed in claim 1 and further comprising a Schottky junction in parallel with said electroluminescent diode and said parallel diode, the threshold voltage of said Schottky junction being less than the threshold voltage of said luminescent diode, thereby producing a threshold effect of the light emission of said electroluminescent diode.

4. A device as claimed in claim 3, characterized in that the semiconductor material of the parallel diode comprises a concentration of non-compensated doping impurities which is higher than that of the concentration of doping impurities on either side of the junction of the electroluminescent diode.

5. A device as claimed in claim 1, characterized in that the material of the parallel diode is a semiconductor material the composition of which is related to that of the material of the electroluminescent diode and the forbidden bandwidth of which is larger while the crystal lattices of the two materials correspond.

6. A device as claimed in claim 1, characterized in that the parallel diode has been manufactured from the same semiconductor material as the electroluminescent diode and is doped with impurities of different natures and concentrations so that the internal potential difference of the junction of the parallel diode is higher than the voltage which corresponds to the minimum energy of the radiation recombination junction in the electroluminescent diode.

7. A device as claimed in claim 5, characterized in that the electroluminescent diode has been manufactured from a semiconductor material which is compensated by doping and the parallel diode has been manufactured from the same material which is strongly doped with impurities of different natures and concentrations and is not compensated.

8. A device as claimed in claim 1, characterized in that the materials of the electroluminescent diode and of the parallel diode consist of compounds which have at least one element of the column III and one element of the column V of the periodic table of elements in common.

9. A device as claimed in claim 1, characterized in that the material of the electroluminescent diode is gallium arsenide phosphide of a formula $GaAs_{1-x}P_x$, where $0 \leq x < 0.9$ and the material of the parallel diode is gallium arsenide phosphide having a formula $GaAs_{1-x'}P_{x'}$, where $x + 0.05 < x' \leq x + 0.2 \leq 1$.

10. A device as claimed in claim 1, characterized in that the material of the electroluminescent diode is gallium aluminum arsenide having a formula $Ga_{1-y}Al_yAs$, where $0 \leq y < 0.9$ and the material of the parallel diode is gallium aluminum arsenide having a formula $Ga_{1-y'}Al_{y'}As$ where $y + 0.05 \leq y' \leq y + 0.2 \leq 1$.

11. A device as claimed in claim 6, characterized in that the electroluminescent diode and the parallel diode are manufactured from the same semiconductor material of the formula $GaAs_{1-x}P_x$ where $1 \geq x \geq 0.8$, the electroluminescent diode being doped with nitrogen with a concentration between $10^{17}$ and $10^{20}$ and the parallel diode does not show a nitrogen doping.

12. A device as claimed in claim 6, characterized in that the electroluminescent diode has been manufactured from a material which is compensated by doping with an amphoteric element, in which the parallel diode has been made from a non-compensated material of the same composition.

13. A method of manufacturing a device as claimed in claim 1, characterized in that one of the two diodes is formed in a monocrystalline substrate and the other diode in an epitaxial layer which is deposited on said substrate.

* * * * *

UNITED STATES PATENT AND TRADEMARK OFFICE

CERTIFICATE OF CORRECTION

PATENT NO. : 3,927,344

DATED : December 16, 1975

INVENTOR(S) : JACQUES LEBAILLY

It is certified that error appears in the above-identified patent and that said Letters Patent are hereby corrected as shown below:

Column 2, line 18, cancel "Above"

line 26, cancel "dynamic" (second occurrence)

Column 3, line 29, "0.02" should be --0.20-- line 31, after "for" insert --the--

Signed and Sealed this

Third Day of May 1977

[SEAL]

*Attest:*

RUTH C. MASON
*Attesting Officer*

C. MARSHALL DANN
*Commissioner of Patents and Trademarks*